United States Patent
Romanov et al.

(10) Patent No.: US 9,989,583 B2
(45) Date of Patent: Jun. 5, 2018

(54) CROSS-BAR UNIT FOR A TEST APPARATUS FOR CIRCUIT BOARDS, AND TEST APPARATUS CONTAINING THE FORMER

(71) Applicant: atg Luther & Maelzer GmbH, Wertheim/Reicholzheim (DE)

(72) Inventors: Victor Romanov, Wertheim (DE); Bernd-Ulrich Ott, Künzelsau (DE)

(73) Assignee: Xcerra Corporation, Norwood, MA (US)

( * ) Notice: Subject to any disclaimer, the term of this patent is extended or adjusted under 35 U.S.C. 154(b) by 401 days.

(21) Appl. No.: 14/209,646

(22) Filed: Mar. 13, 2014

(65) Prior Publication Data

US 2014/0266276 A1    Sep. 18, 2014

Related U.S. Application Data

(60) Provisional application No. 61/780,501, filed on Mar. 13, 2013.

(51) Int. Cl.
   *G01R 31/28*    (2006.01)
(52) U.S. Cl.
   CPC ................... *G01R 31/2808* (2013.01)
(58) Field of Classification Search
   CPC ................................................. G01R 1/06705
   See application file for complete search history.

(56) References Cited

U.S. PATENT DOCUMENTS

| | | | | |
|---|---|---|---|---|
| 4,267,507 A | * | 5/1981 | Guerpont | G01R 1/07314 324/750.25 |
| 5,107,206 A | * | 4/1992 | Yanagi | G01R 31/2806 269/71 |
| 5,850,146 A | * | 12/1998 | Shim | G01R 1/06705 324/750.23 |
| 5,977,776 A | | 11/1999 | Huth et al. | |
| 6,344,751 B1 | | 2/2002 | Prokopp et al. | |
| 6,384,614 B1 | | 5/2002 | Hager et al. | |
| 6,657,449 B2 | * | 12/2003 | Song | G01R 31/2806 324/755.01 |

(Continued)

FOREIGN PATENT DOCUMENTS

| | | |
|---|---|---|
| EP | 0 458 280 A2 | 11/1991 |
| EP | 0 468 153 A1 | 1/1992 |

(Continued)

OTHER PUBLICATIONS

Search Report dated Oct. 9, 2013 for German Patent Application DE 10 2013 102 564.1, citing above listed references EP 1 217 382 A2 and EP 0 458 280 A2, 8 pages (no translation available).

*Primary Examiner* — Paresh Patel
(74) *Attorney, Agent, or Firm* — Lewis Roca Rothgerber Christie LLP (57) ABSTRACT

A cross-bar unit for a test apparatus for circuit boards having at least one cross-bar spanning a test field in which a circuit board to be tested may be placed, and is configured to hold positioning units for test fingers in a linearly traversable manner so that the test fingers are able to scan at least part of the test field. The cross-bar unit is configured to hold at least two linear guides, independent of one another, for guiding in each case at least one of the positioning units.

12 Claims, 10 Drawing Sheets

(56) References Cited

U.S. PATENT DOCUMENTS

| | | | | |
|---|---|---|---|---|
| 6,677,773 B2* | 1/2004 | Prokopp | ............ | G01R 1/07335 |
| | | | | 324/750.25 |
| 7,015,711 B2 | 3/2006 | Rothaug et al. | | |
| 7,119,558 B2* | 10/2006 | Romanov | ............... | G01R 1/067 |
| | | | | 324/750.24 |
| 7,250,782 B2* | 7/2007 | Romanov | .......... | G01R 1/06705 |
| | | | | 324/750.18 |
| 7,420,381 B2* | 9/2008 | Burcham | .......... | G01R 1/06705 |
| | | | | 324/750.02 |
| 7,821,278 B2* | 10/2010 | Romanov | ............ | G01R 31/309 |
| | | | | 324/756.07 |
| 7,859,281 B2* | 12/2010 | Romanov | .......... | G01R 1/06794 |
| | | | | 324/754.07 |
| 7,876,111 B1* | 1/2011 | Lin | .................... | G01R 31/2815 |
| | | | | 324/750.19 |
| 8,008,938 B2* | 8/2011 | Ni | ...................... | G01R 31/2806 |
| | | | | 324/754.01 |
| 2005/0001639 A1 | 1/2005 | Romanov | | |
| 2014/0291270 A1* | 10/2014 | Heiniger | ................ | B25J 11/005 |
| | | | | 212/324 |

FOREIGN PATENT DOCUMENTS

| | | |
|---|---|---|
| EP | 0 853 242 A1 | 7/1998 |
| EP | 0 990 912 A2 | 4/2000 |
| EP | 1 217 382 A2 | 6/2002 |
| EP | 1 451 594 B1 | 9/2005 |
| WO | WO 03/096037 A1 | 11/2003 |

* cited by examiner

CROSS-BAR UNIT FOR A TEST APPARATUS FOR CIRCUIT BOARDS, AND TEST APPARATUS CONTAINING THE FORMER

CROSS-REFERENCE TO RELATED APPLICATION(S)

This Patent Application claims the benefits of U.S. Provisional Patent Application Ser. No. 61/780,501, filed on Mar. 13, 2013 and entitled "Cross-Bar Unit for a Test Apparatus for Circuit Boards, and Test Apparatus Containing the Former", the entire content of which is hereby expressly incorporated by reference.

FIELD OF INVENTION

The present invention relates to a cross-bar unit for a test apparatus for circuit boards, and a test apparatus for circuit boards with such a cross-bar unit.

BACKGROUND OF THE INVENTION

Test apparatus for the testing of circuit boards may be divided basically into two groups: the group of finger testers (flying probers) and the group of parallel testers. Parallel testers are test devices which, by means of an adapter, are able to contact simultaneously all or at least most contact points of a circuit board to be tested. Finger testers are test devices for the testing of non-componented or componented circuit boards which scan the individual contact points in sequence using two or more test fingers.

The test fingers are usually mounted on a slide, along which cross-bars are able to traverse, while the cross-bars in turn are guided and able to traverse on guide rails. Each test finger has a swivel arm, on the end of which a contact tip for contacting the circuit board is formed. By traversing the slide and rotating the swivel arm, the test fingers may therefore be positioned with their contact tips at any desired point in a test field, generally rectangular. To contact a contact point of a circuit board to be tested, either the slide is designed to be able to move vertically on the cross-bar or the test probe is designed to move vertically on the slide, so that the test finger may be placed from above or below on the contact point of the circuit board, the circuit board test point.

A finger tester is described in EP 0 468 153 A1 and a method for testing circuit boards by means of a finger tester is described in EP 0 853 242 A1. Test probes for finger testers are disclosed in EP 1 451 594 B1; US 6,384,614 B1; WO 03/096037 A1; and EP 0 990 912 A2.

A finger tester of this kind is usually provided with at least two traversable contact fingers, so as to be able to reach test points spaced apart along the cross-bar axis, and several cross-bars are provided above the test field and (at any rate for the testing of circuit boards printed on both sides) several cross-bars below the test field, for reaching test points spaced apart in a second coordinate direction at right-angles to the cross-bar axis. (In principle, a circuit board may be tested with only a single test finger, if capacitive measurement is used. In this case, in theory, only one test finger is needed. It is however preferred to have two test fingers mounted on a rail, since an ohmic measurement requires a closed circuit, and therefore two test fingers are needed). For the use of automated test methods involving a finger tester it is important to know precisely the relative position of the cross-bars both to one another and to the test field. In the finger tester described in EP 0 466 153, the cross-bars are mounted in a stand, at right-angles to the direction of traversing of the test finger, so as to be traversable. Because of play in the traversing of the cross-bars, often unavoidable, the spacing of the cross-bars has a certain fluctuation width and, depending on the drive system used, slipping may cause the spacing of the cross-bars to move out of a preset field of tolerance, requiring readjustment. The associated adjustment and calibration processes for at least four cross-bars are time-consuming and often lead to inaccuracies.

Also known are finger testers in which the cross-bars are fixed immovably in a stand. Since the cross-bars are suspended in a stand both above and below the circuit board, they must be carefully and individually adjusted. The length of the swivel arms may be optimized in respect of a distance between the cross-bars, so that the test field between the cross-bars may be reached in the optimal manner. If such a finger tester has to be adapted to changed process conditions, perhaps because the scanning density needs to be increased or reduced, then it is necessary to fit additional cross-bars, or to remove or refit existing cross-bars. This also involves considerable effort for adjustment of the cross-bars relative to one another and to the test field, and for calibration of the software.

SUMMARY

The invention is based on the problem of avoiding at least partly the disadvantages of the prior art. A particular problem of the invention is to reduce the effort and expense of adjustment and calibration in a test apparatus for the testing of circuit boards using test fingers. A further problem of the invention is to make the adaptation of such test apparatus to changed process conditions a speedy and efficient operation.

The problem specified above is solved at least partly by the features of the independent claims 1 and 13. Preferred embodiments and advantageous developments of the invention are specified in the dependent claims.

According to one aspect of the present invention, a novel cross-bar unit for a test apparatus for circuit boards is proposed. The cross-bar unit has at least one cross-bar spanning a test field in which a circuit board to be tested may be placed, and is designed to hold positioning units for test fingers in a linearly traversable manner so that the test fingers are able to scan at least part of the test field. The cross-bar unit is also designed to hold at least two linear guides, independent of one another, for guiding in each case at least one of the positioning units.

In other words, the test apparatus is an apparatus for the testing of non-componented or componented circuit boards, wherein the circuit boards are arranged in a test field and test fingers scan the individual contact points sequentially. For the purposes of the invention, a cross-bar unit is understood to mean a one-piece or connected but at any rate a shape forming a solid unit which has at least one cross-bar spanning the test field. Consequently the cross-bar unit may have or be formed by a single cross-bar or may have several cross-bars, combined to form a solid structural unit. For the purposes of the invention, the cross-bar unit is to be distinguished from a stand of the test apparatus which is fixed in space, in which the cross-bar unit is mounted. A linear guide is for the purposes of the invention a guide, e.g. a rail, for linear guidance of the positioning units, in particular in a straight line. A traversing drive may be integrated in the linear guide, but may also be provided separately. Independence of the linear guides is understood to mean, for the purposes of the invention, that positioning units of different linear guides do not interfere with one another during traversing. In particular, the linear guides run parallel with clearance from one another. If only capacitive scanning of the test points on the circuit board takes place, then one positioning unit (for one test finger) per linear guide is sufficient. Since resistive scanning often also takes place, two positioning units with test finger per linear guide are preferred. More positioning units per linear guide are also possible.

According to this aspect of the present invention, at least two groups of positioning units may traverse on a single cross-bar unit without the traversing paths of the two groups affecting one another (wherein a group may comprise one or more positioning units). Since the linear guides are attached to a single component, the alignment of the linear guides to one another is exactly defined and unchangeable. The effort required for adjustment and calibration is therefore less. The cross-bar unit according to the invention may be mounted immovably on a stand of the test apparatus or may itself be mounted so as to be capable of traversing. In contrast to a traversable cross-bar with only one linear guide, in the case of the cross-bar unit according to the invention at least two linear guides have an unchangeable relative position, so that the work required for adjustment and calibration is at least halved. The more linear guides are provided on the cross-bar unit, the more important does this advantage become.

In an embodiment the linear guides are provided at the side of each cross-bar. Here, at the side means a direction at right-angles to the longitudinal direction of the cross-bar, parallel to the test field plane. With side mounting, the positioning units in the test apparatus are much more accessible.

In an embodiment, at least one of the cross-bars has two of the linear guides, which run parallel to one another. This arrangement also has the advantage that pairs of test points, spaced apart at right-angles to the cross-bar direction, may be tested by a single cross-bar within the range of the test finger, with no need to change the position of the cross-bar. The two linear guides are arranged on a single cross-bar, so that their relative position to one another is exactly defined and unchangeable. The cross-bar unit may have one or more such cross-bars with two linear guides.

In an embodiment, the cross-bar unit has at least two cross-bars spanning the test field, wherein each of the two or more cross-bars has at least one of the linear guides, while the two or more cross-bars run preferably parallel to one another. In this embodiment the two linear guides are mounted on a single cross-bar unit, i.e. form a connected component, so that their relative position to one another is exactly defined and unchangeable. In combination with the previous embodiment, the cross-bar unit with two cross-bars may already have four linear guides and thus four groups of test fingers able to traverse independently of one another. Two or more cross-bars may be prepared as modules and joined together in a simple manner to provide a fixed three-dimensional form. This simplifies considerably the production of different test apparatus units, since the cross-bar units with several linear guides may be used as modules, wherein all positioning units are already exactly aligned relative to one another. If cross-bars of the cross-bar unit are so connected that they come to lie adjacent to one another (i.e. on the same side of the test field), it is advantageous to make the spacing of the cross-bars such that all points between the cross-bars may be reached by test fingers. So in this case too, pairs of test points spaced apart at right-angles to the cross-bar axis may be tested within the range of the test fingers, without there being any need to change a position of the cross-bar unit.

In an embodiment, at least one of the two or more cross-bars runs on one side of a test field plane of the test field, and at least one on the other side of the test field plane. The test field in which the circuit boards may be held has a main plane within which the circuit board extends. This main plane is also described as the test field plane. In this embodiment, the guides are arranged this side and the other side of the test field on a single cross-bar unit, i.e. an integral unit, so that their relative position to one another is exactly defined and unchangeable. Each of the two cross-bars may have one or two linear guides. If for example a circuit board to be tested has distinctly more test points on one side than on the other side, then the cross-bar spanning the side with the greater number of test points may have two linear guides, while the cross-bar on the other side has only one linear guide.

In an embodiment, the two or more cross-bars are precisely two cross-bars, joined by connection pieces into an annular shape which is at least substantially rectangular, so that the cross-bar unit spans the test field in such a way that the test field is positioned between the two cross-bars. In other words, the cross-bar unit forms a rectangular frame with two cross-bars, which span the test field on one side and the other (at front and rear of the circuit boards to be tested). Thus, the cross-bars with the connection pieces form a structural unit which surrounds the test field. Through combination of the embodiments it is possible with this frame-like cross-bar unit to assemble four linear guides with four groups of test fingers (two on one side and two on the other side of the test field plane) to form a testing module, wherein the relative position to one another of the linear guides is exactly defined and unchangeable. The annular shape may be for example cast in one piece or also produced by a welded part of plates or profiles welded together. Defined connection points and planes for the linear guides, for drives, measuring and control devices, cable guides, etc. and for connection to the stand may be formed by essentially known re-machining measures. A rectangular annular form is comparatively easy to produce, and easy to handle for storage, transport and installation.

In an advantageous development, the cross-bar unit is prepared for secure mounting at preset connection points of a stand of the test apparatus. By this means, the position of the cross-bar unit relative to the stand is exactly defined and unchangeable. Consequently, depending on the combination of embodiments, two to four or more linear guides are already exactly defined and unchangeable in their position in the test apparatus. In principle it is of course also possible for the cross-bar unit itself to be mounted so as to be traversable on the stand. The benefits of the invention are also achieved in this case, at least partly.

In an embodiment, each of the positioning units has a swivel unit and a traversing unit, wherein each test finger has a swivel arm connected to the swivel unit of an associated positioning unit, and a test probe fastened to the swivel arm, while the traversing unit is in each case mounted in one of the linear guides and may be traversed by means of a drive unit, and wherein the linear guides are attached to the cross-bar unit. The swivel arm guidance facilitates positioning of the test finger at right-angles to the linear guide without shifting or traversing of the cross-bar unit itself. This makes it easier to attach the cross-bar unit firmly to a stand, while where applicable several cross-bar units may be needed to cover the length of the test field. But even with a traversing cross-bar unit, positioning by the swivel arm, due to the lower masses to be moved, is quicker, more stress-free and more energy-efficient than a traversing of the whole cross-bar unit. If two linear guides are provided on one cross-bar, the swivel arms make it possible to reach the area of the test field between the positioning units. The drive unit may be at least partly in the form of a part of the positioning unit (perhaps as rotor of a linear drive or as a pinion, with an associated stator or a toothed rail attached to the cross-bar unit), or may be attached separately to the cross-bar unit (perhaps in the form of a piston or a control wire). The swivel unit may have a step motor or a non-rotating linear motor (linear motor with curved movement path). In addition to a swivel unit to achieve positioning coplanar to the test field plane, a lifting unit may also be provided to effect positioning at right-angles to the test field plane. The lifting unit may for example have a linear motor. The lifting unit and the swivel unit may be combined structurally to form a lift-swivel unit. For reasons of weight, the swivel arms are preferably made of carbon fibre.

In an advantageous development, an axial distance of the swivel axis of the swivel unit of a positioning unit from the respective linear guide and/or a probe distance of a test probe from the swivel axis of the swivel unit of a positioning unit are/is changeable, with the axial distance and/or the probe distance preferably being changeable in preset steps. Variation of the distances allows adaptation of the position of the swivel axis to respective process and/or testing conditions. It is for example possible, with a large probe distance, to scan a large area with a single cross-bar unit, while with a small probe distance the speed and accuracy of positioning can be increased. In order to increase the rate of scanning altogether and therefore also the throughput of circuit boards to be tested, several cross-bar units (modules) of the same type may be added, involving the selection of a smaller probe distance. If two linear guides are provided on one cross-bar, in particular in each case on opposite sides of the cross-bar, it is advantageous to change not only the probe distance but also at the same time the axial distance, for optimal scanning of the area between the swivel axes. In order to increase the rate of scanning and therefore also the throughput of circuit boards to be tested, a second cross-bar unit of the same type may be added, with the axial distances and probe distances being reduced. The test apparatus may therefore be equipped, depending on the performance requirement, by adding a second module and changing only the distances of the first (old) module.

In an embodiment, connecting faces of two structural components of the positioning unit are designed as an interface for changing the axial distance, involving preferably the attachment of spacers of preset thickness to change the axial distance between the connecting faces. With this design, it is possible to vary the axial distance in a simple manner, since such connecting faces are often provided in any case. The interface may be provided for example between the swivel unit and the traversing unit. It is also possible to provide the interface between the swivel unit and a lifting unit or between a lifting unit and the traversing unit, depending on the structural sequence of the units. An especially simple solution may be obtained if the connecting faces lie parallel to the direction of traversing and at right-angles to the testing plane and are optionally screwed together directly or with an intermediate spacer. In one variant, the interface may be realized by connecting faces lying parallel to the test field plane, wherein the connecting faces may be connected by optionally usable screwing points or the like at varying distances from the traversing unit. In the latter case, the connecting faces may be provided with latching devices which clearly indicate the adjustable distances in preset steps.

To change the probe distance, swivel arms of different lengths may be provided, for fitting between the swivel axis and the test probe. This makes possible a variation of the probe distance which is simple from the design standpoint and involves minimal effort in use. Here it is especially advantageous if the probe distance can be adapted to the relevant axial distance, wherein in particular spacers to fix the axial distance and swivel arms to fix the probe distance, with suitably matched spacer thickness and swivel arm length respectively are provided. If the distance of the swivel axis from the linear guide is changeable, it is also possible to change the range of the test fingers by using swivel arms with adapted length. It is also possible, by using long swivel arms and spacers, to scan a large area with a single cross-bar unit. To increase the rate of scanning and therefore also the throughput of circuit boards to be tested, a second cross-bar unit of the same type may be added, wherein the distances of the swivel axes may be reduced by removing or exchanging the spacers, and the long swivel arms may be replaced by short swivel arms. The test apparatus may therefore be equipped according to the performance requirement by adding a second module, with only the distances and the swivel arms of the first (old) module needing to be changed. On the other hand it is possible to make out of one test apparatus with several cross-bar units, small axial and probe distances and high throughput for relatively low effort, two or more test apparatus units with correspondingly lower throughput, by providing a second (or third, etc.) stand with respective circuit board feed, and fitting one or more cross-bar units from the one test apparatus into the new stand and increasing the distances by incorporating suitable spacers and swivel arms. Such arrangements therefore permit the production of different test apparatus units—with few or many cross-bars with different distances between the cross-bar units, using substantially the same parts, and with only the spacers and swivel arms needing to be replaced as a matched set of components. This may lead to considerable savings in production costs while still maintaining a high level of precision.

According to another aspect of the invention, a test apparatus for circuit boards using test fingers is proposed, wherein the test fingers are so mounted and traversable that a test field in which a circuit board to be tested is placed may be scanned by the test fingers. According to the invention, the test apparatus has at least one cross-bar unit according to one of the above claims.

In other words, a test apparatus with up to four groups of test fingers may already be realized with a cross-bar unit with two cross-bars. The one cross-bar unit is able to carry all the required test fingers. Depending on the size of the test field, several cross-bar units may be used.

In an embodiment, the test apparatus has an immovable stand, while the stand has a multiplicity of connection points which facilitate fixing of the cross-bar unit or units in different positions relative to the test field. The position(s) of the cross-bar unit(s) relative to the stand are thereby exactly defined and unchangeable. Several cross-bar units may be mounted on the stand as modules with two, three, four or more groups of test fingers at different intervals. The intervals may be determined according to the length of the swivel arms of the test fingers. In this way the test apparatus may be dimensioned and scaled as desired. The linear guides are exactly aligned solely by the stand and the cross-bar unit(s). If the cross-bar arrangement is a rectangular frame with two cross-bars running either side of the test field, then the stand may be realized for example in a simple manner by two fixed floor beams a defined distance apart, on which the cross-bar unit(s) will be aligned and fastened. For precise and reliable alignment it is advantageous if the beams and the cross-bar unit(s) are suitably stiff and capable of being aligned rigidly to one another.

BRIEF DESCRIPTION OF THE DRAWINGS

The invention will be explained in more detail below with the aid of the appended drawings, in which.

DETAILED DESCRIPTION

Figure 1:
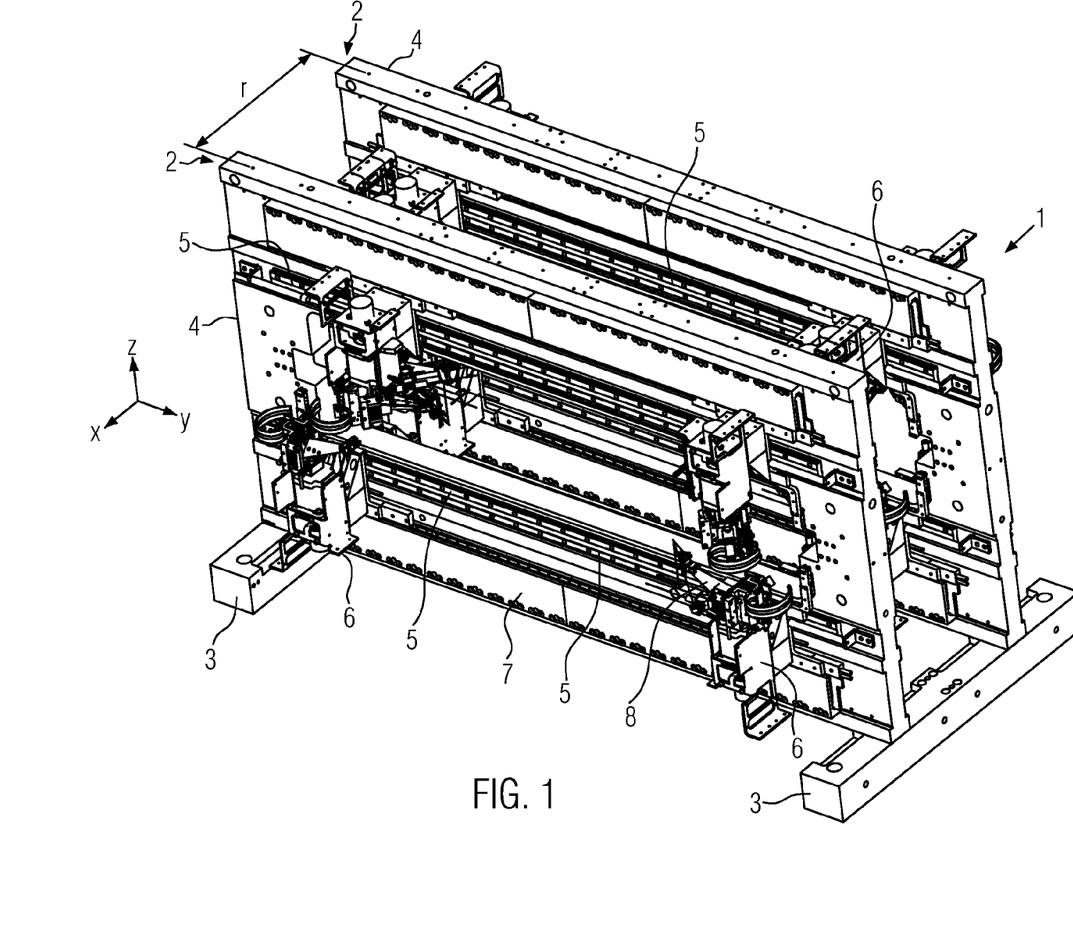
FIG. 1 is a three-dimensional illustration of a test apparatus for circuit boards with test fingers (so-called finger tester) as an embodiment of the present invention.

FIG. 1 shows a test apparatus 1 with test fingers (so-called finger tester) for the testing of circuit boards as an embodiment of the present invention in a three-dimensional view.

According to the illustration in FIG. 1, the test apparatus has two cross-bar units 2, which are mounted on two mounting beams 3. For the purposes of the invention, the mounting beams 3 form a stand. Each cross-bar unit 2 is formed by a frame 4 with mounted attachments. The frame 4 is described in more detail below. Each frame 4 carries several linear guides (rails) 5, on each of which two positioning units 6 are mounted so as to be able to traverse. Each of the positioning units 6 may be driven by a stator unit 7 and carry a test finger 8.

For further orientation, a Cartesian coordinate system with spatial directions x, y, z is specified in which, without limiting generality, spatial direction x is designated as longitudinal direction x, spatial direction y as transverse direction and spatial direction z as vertical direction. The longitudinal direction x may also be described as the direction of feed x, since the circuit boards to be tested are fed (and discharged) in this direction x in the test apparatus 1. The direction of feed x corresponds to a direction of extension of the mounting beam 3, and a main plane of the frame 4 encloses the y and z spatial directions.

Although not shown in detail in this Figure, the mounting beams 3 are bolted immovably to a factory work floor or the like, and the frames 4 are bolted firmly to both mounting beams 3. The mounting beams 3 may therefore also be described as a stand for the frame 4. The frames 4 are mounted at a frame interval r in the x direction.

Figure 2:
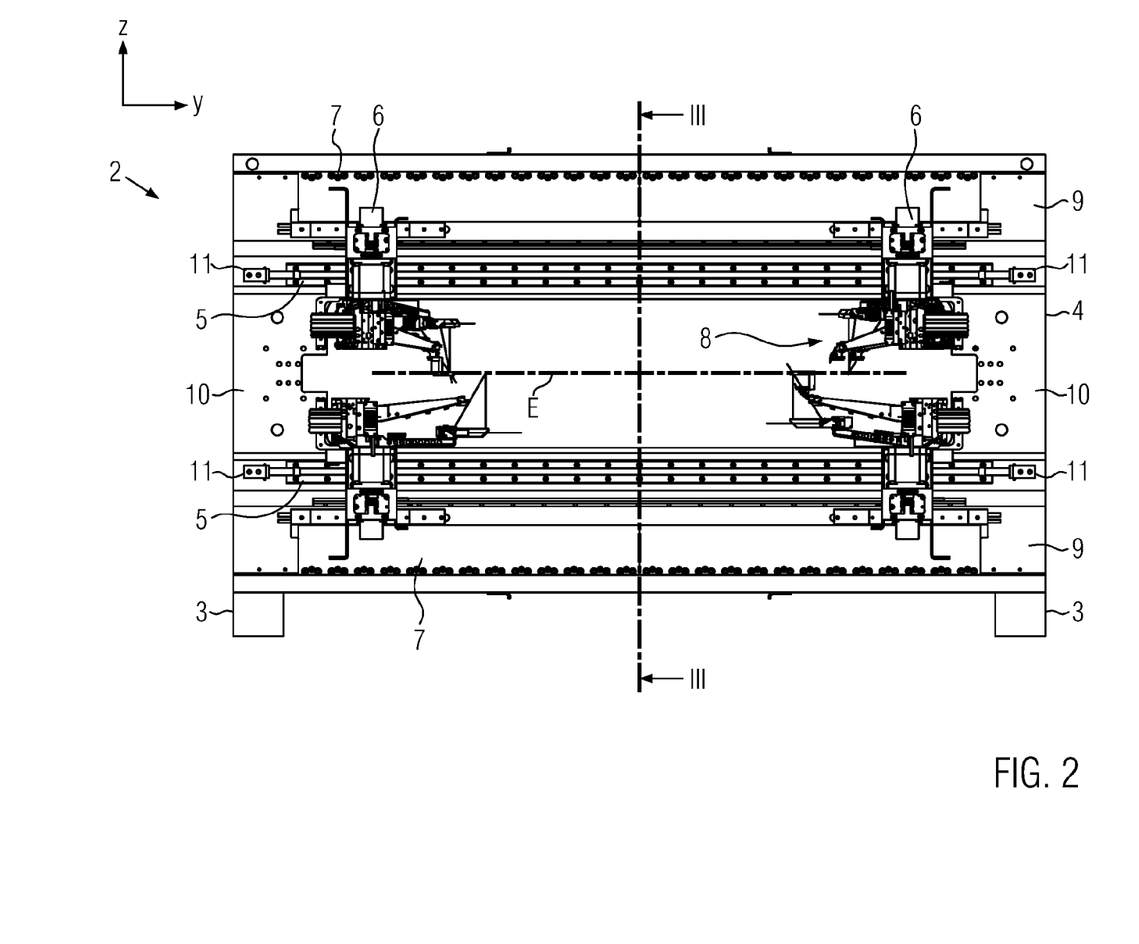
FIG. 2 is a front view of the test apparatus of FIG. 1.

FIG. 2 shows the test apparatus 1 from spatial direction x, i.e. in a front view.

According to the illustration in FIG. 2, the frame 4 is a single-piece part which may be divided into two parallel cross-bars 9 and two crosspieces 10 connecting the cross-bars 9 at their ends. Without loss of generality, the cross-bars 9 extend in the transverse direction y and the crosspieces 10 in the vertical direction z of the test apparatus 1. With no loss of generality, the side of the frame 4 shown in Fig, 2 is described as the front side, and the side which is concealed in the Figure is described as the rear of the frame 4. The frame 4, in the embodiment shown and described here, is made from a single steel plate, from which a window has been cut, for example by a cutting torch or the like. Alternatively, the frame 4 may also be produced as a casting or a welded part.

The cross-bars 9 and crosspieces 10 surround a testing plane E. The testing plane E shows a position of circuit boards (not shown in detail) which may be tested in the test apparatus 1, encloses the spatial directions x and y and has approximately the same distance from the cross-bars 9.

Each of the cross-bars 9 has on the front shown in FIG. 2 a linear guide 5 and a stator unit 7. The linear guide 5, in the form of a rail, extends parallel to the stator unit 7 in the transverse direction y and is closer to the testing plane E than the stator unit 7. As described above, two positioning units 6 are slidably mounted on each linear guide 5, with each positioning unit carrying a test finger 8. End stops 11 limit the movement of the positioning units 6 on the linear guides 5. The respective test fingers 8 face towards the testing plane E and are mounted with lifting and swiveling facility in the associated positioning unit 6. In other words the test fingers 8, which are guided on the upper of the cross-bars 9, face downwards (negative z direction), and the test fingers 8 guided on the lower of the cross-bars 9 face upwards (positive z direction).

Figure 3:
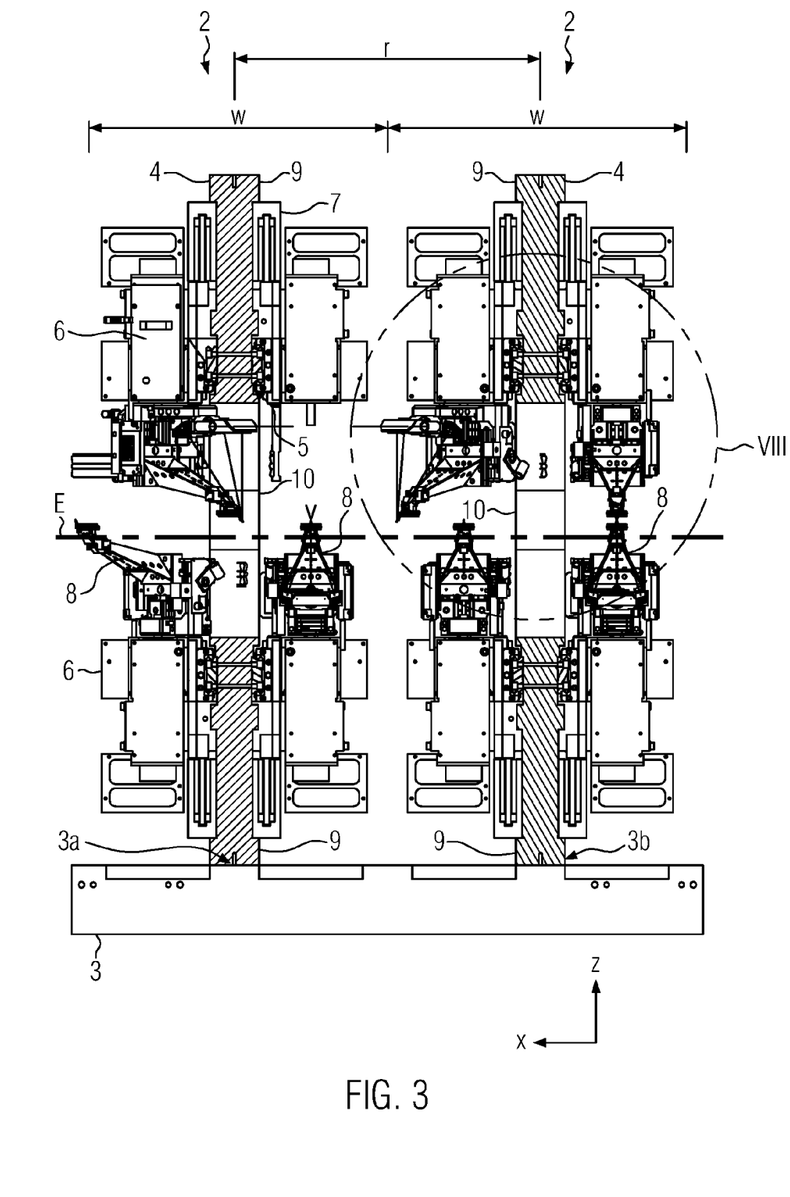
FIG. 3 is a cross-sectional view of the test apparatus along a line "III-III" of FIG. 2.

FIG. 3 shows a cross-section through a test apparatus 1 along a line in FIG. 2 in the direction of the arrows indicated there.

In the sectional view in FIG. 3 it is possible to see that the cross-bars 9 of the frame 4 are identically equipped on front and rear with linear guides 5, stator units 7, positioning units 6 and test fingers 8. The test fingers 8 are mounted pivotably on the positioning units 6 and in the x direction are able to reach not only an area between the positioning units 6 but also an area either side of the positioning units 6. Together the test fingers 8 on the front and rear of the frame 4 cover a scanning width w. The frame interval r between the frames 4 is chosen so that the scanning ranges of the respective test fingers 8 reach one another exactly in the x direction.

As shown further in FIG. 3, the frames 4 rest with the lower of their cross-bars 9 on support surfaces 3a, 3b provided at the frame interval r on top of the mounting beams 3. The position of the support surfaces 3a, 3b is preset exactly and, by means not shown in detail, the frames 4 are aligned precisely (centered) on the support surfaces 3a, 3b and securely but releasably connected (possibly bolted) to the mounting beams 3.

Figure 4:
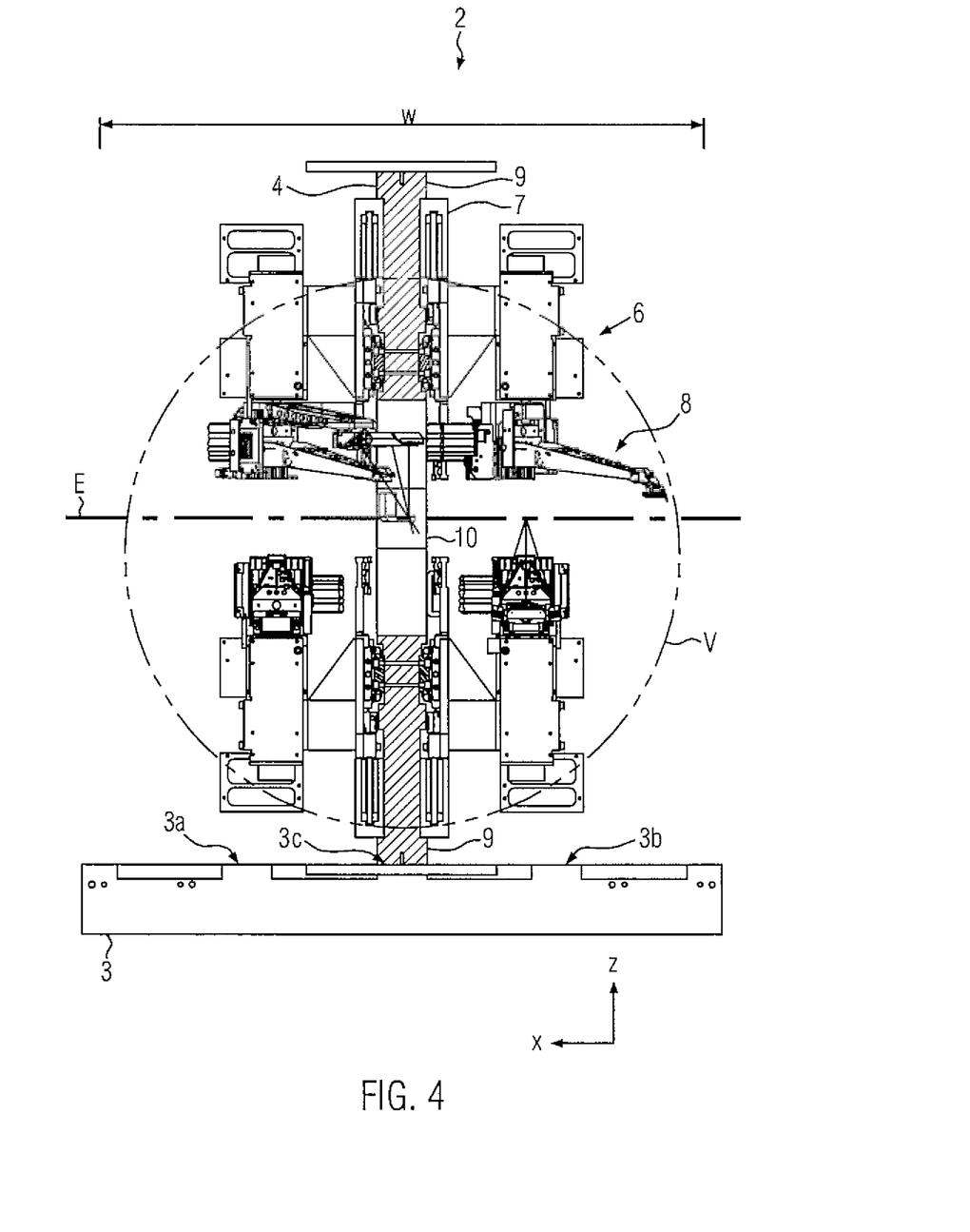
FIG. 4 is a view corresponding to FIG. 3 of a second type of assembly of the test apparatus.

FIG. 4 shows a cross-section through the test apparatus 1 in a view corresponding to FIG. 3. Shown in FIG. 4 is a second type of assembly which differs from the (first) type of assembly shown in FIG. 3.

According to FIG. 4, in this type of assembly, not two cross-bar units, but instead only one cross-bar unit 2 is provided. The cross-bar unit 2 is as before formed by a frame 4 with further attachments 5, 6, 7, 8, etc., wherein the frame 4 is a single component made up of two cross-bars 9 and two connection pieces or crosspieces 10.

In the sectional view in FIG. 4 it can be seen that the cross-bars 9 of the frames 4 are equipped identically at front and rear with linear guides 5, stator units 7, positioning units 6 and test fingers 8. The test fingers 8 are mounted pivotably on the positioning units 6 and in the x direction can reach both an area between the positioning units 6 and also an area either side of the positioning units 6. Together the test fingers 8 of the cross-bar unit 2 on front and rear of the frame 4 cover a scanning width w. A modification of the positioning unit 6 and the test finger 8 described in detail below results in the scanning width w of the test fingers 8 of this cross-bar unit 2 being greater than that of the two cross-bar units of the previous type of assembly.

As also shown in FIG. 3, the frame 4 rests with the lower of its cross-bars 9 on a support surface 3c provided between the two support surfaces 3a, 3b described earlier. The position of the support surfaces 3a, 3b, 3c relative to one another is exactly preset and, by means not shown in detail, the frame 4 is exactly aligned (centered) on the support surface 3c, and securely but releasably connected (for example bolted) to the mounting beam 3.

Figure 9:
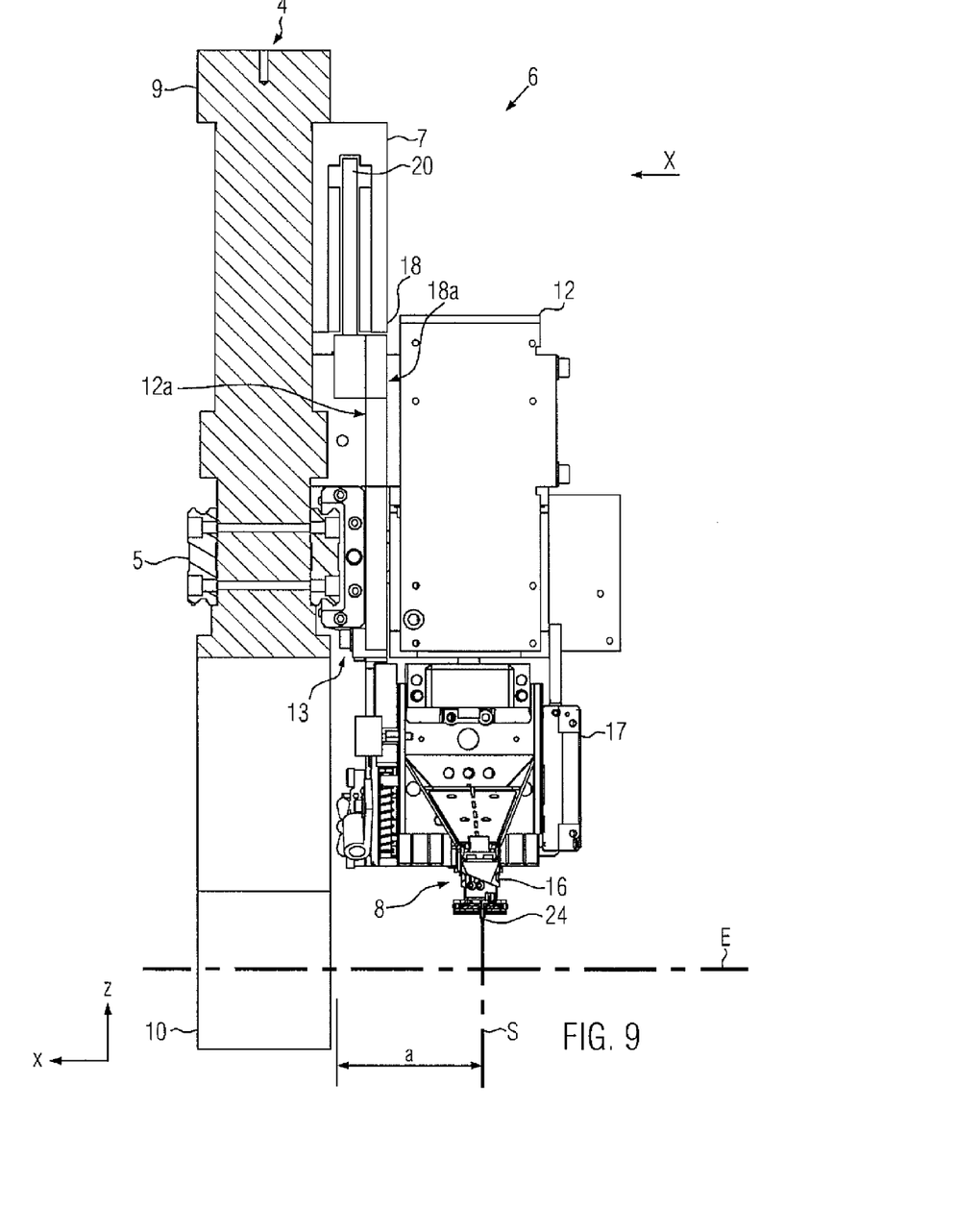
FIG. 9 is a further enlarged detail view through a line "IX" in FIG. 8.
Figure 10:
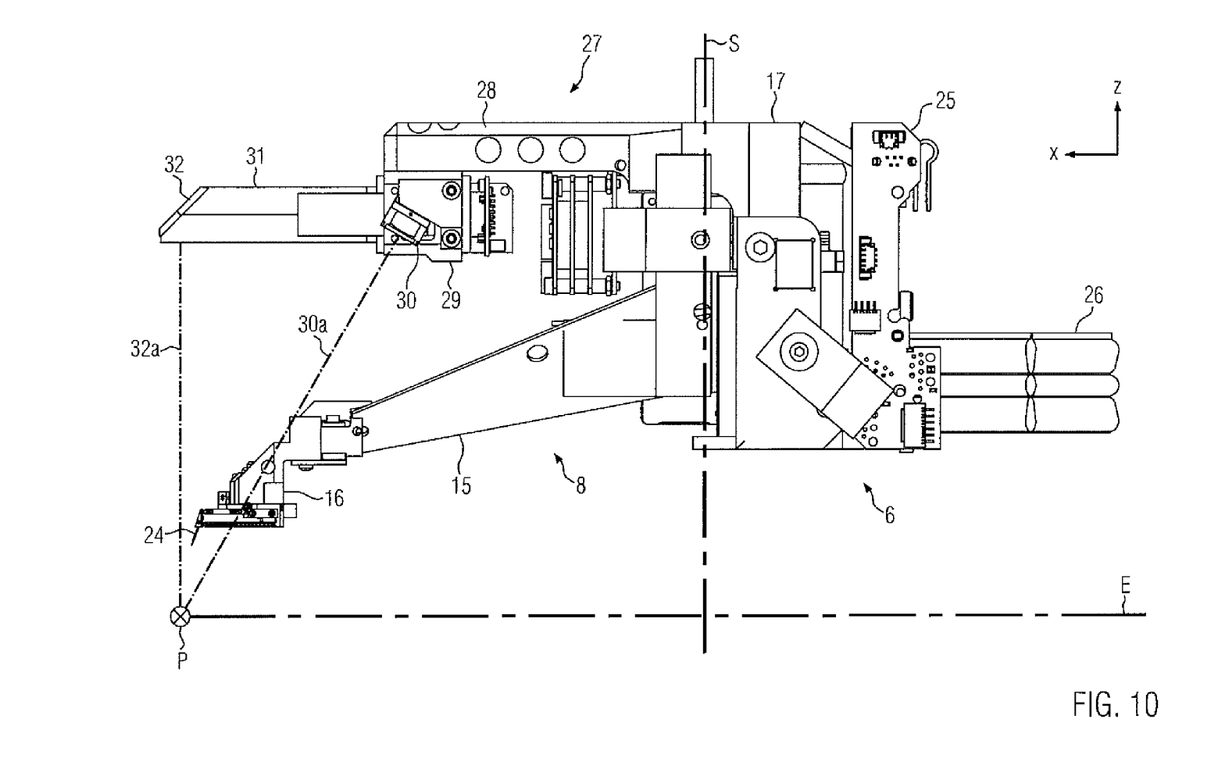
FIG. 10 is a view in the direction of arrow "X" in FIG. 9.

The second type of assembly according to FIG. 4 will firstly be described below with the aid of FIGS. 5 to 7, after which a return will be made to the first type of assembly according to FIGS. 1 to 3, with the aid of FIGS. 8 to 10.

Figure 5:
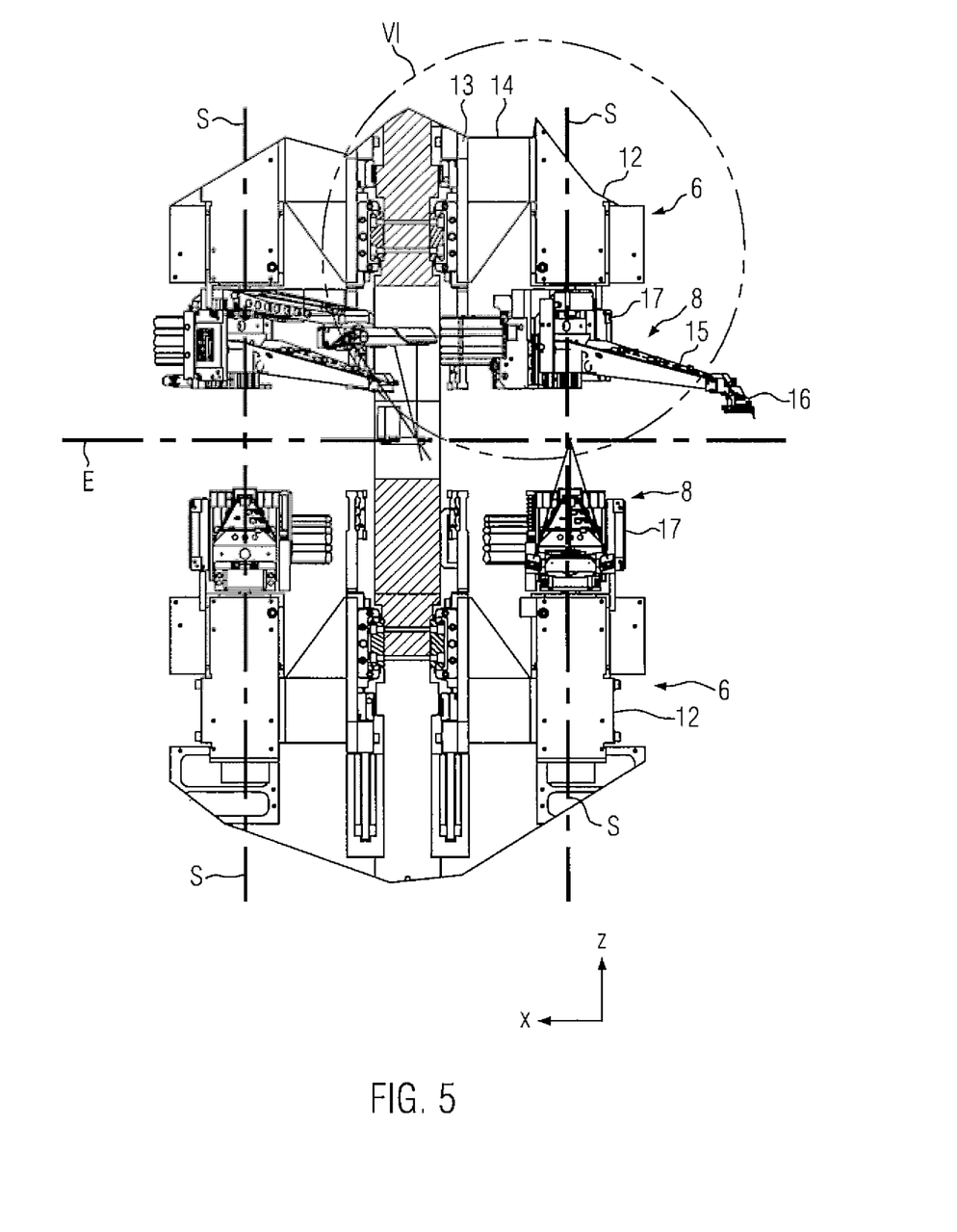
FIG. 5 is an enlarged detail view through a line "V" in FIG. 4.

FIG. 5 shows, in an enlarged view, a detail indicated in FIG. 4 by a dot-dash line "V". It should be noted that swivel positions of each test finger 8 may differ from those of FIG. 4.

As shown in FIG. 5, the positioning unit 6 has a swivel unit 12 with a swivel axis S. The swivel unit 12 has a swivel drive with an output shaft (not shown in detail here), which has a swivel axis S. The positioning unit 6 also has a traversing unit 13 which is mounted on the linear guide 5. The swivel unit 12 is fixed to the traversing unit 13 via a spacer 14. The test finger 8 has a swivel arm 15, which may be swiveled by the output shaft of the swivel unit 12, and on the end of which is attached a needle holder 16 to hold a test needle, not shown in detail here. The positioning unit 6 finally has a lifting unit 17, which is able to lower and raise the test finger 8.

Figure 6:
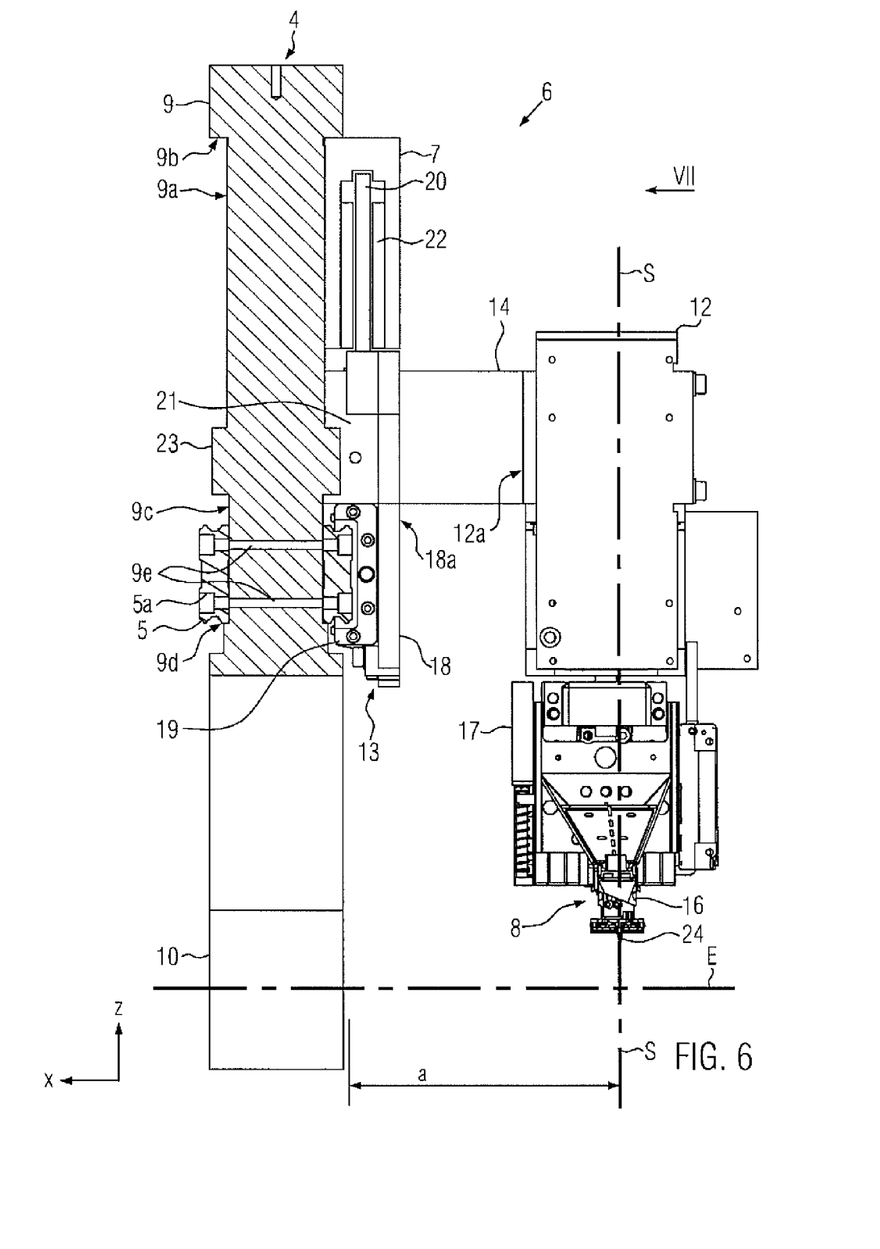
FIG. 6 is a further enlarged detail view through a line "VI" in FIG. 5.

An even more detailed view is given in FIG. 6, showing in a further enlarged view a detail defined by a dot-dash line "VI" in FIG. 5. More specifically, this detail shows the upper cross-bar 9 in section with a crosspiece 10 in the background and the attachments fitted to one side of the cross-bar 9. It should be noted that the other side of the cross-bar is equipped in the same manner.

As shown in FIG. 6, the cross-bar 9 has formed in each side surface (front and rear) a stator locating surface 9a to accommodate a stator unit 7, with a vertical alignment (alignment in the z direction) of the stator unit 7 being fixed by a top edge 9b. The stator unit 7 is firmly screwed to the cross-bar 9.

Also formed on each side of the cross-bar 9 is a rail locating surface 9c to hold the linear guide 5 in the form of a rail, wherein a vertical alignment of the rail 5 is fixed by a downwards step 9d. Provided in the rail locating surfaces 9c are pairs of (through) holes 9e, which are flush with counterbored holes 5a of the rail 5. The rails (linear guides 5) are bolted firmly to the cross-bar 9 via the through holes 9e and counterbored holes 5a.

The traversing unit 13 of the positioning unit 6 has a baseplate 18. Fastened to the baseplate 18 are a sliding block 19, a rotor unit 20 and a position encoder 21. The sliding block 19 encompasses the rail 5 in a slidable manner, thus forming a sliding bearing, in combination with the rail 5. It should be noted that, to avoid clamping torques, two sliding blocks 19 may be provided one behind the other. The rotor unit 20 extends upwards into an interior of the stator unit 7, where it runs between permanent magnets 22 which are mounted there and distributed with alternating polarity over the length of the stator unit 7 (in the y direction). The rotor unit 20 has a coil assembly, not shown in detail, which may be excited electrically by a power supply, not shown in detail. The electrodynamic interaction between the rotor coils of the rotor unit 20 and the permanent magnets 22 of the stator unit 7 leads to acceleration or braking and therefore controlled movement of the traversing unit 13 along the linear guide 5. The stator unit 7 and the rotor unit 20 of each positioning unit 6 thus form in each case a (linear) drive unit. The position encoder 21 faces towards a magnetic tape 23 attached to the cross-bar 9 in each case and allows, through scanning of the magnetic tape 23, exact determination of the traverse distance of the traversing unit 13 on the cross-bar 9.

Also to be seen in the Figure is a test needle 24 (also described as a contact probe 24), which is held in the needle holder 16 of the test finger 8 and provides contact with test points on the circuit board, not shown in detail.

The baseplate 18 of the traversing unit 13 has a mounting surface 18a, and a housing of the swivel unit 12 has a mounting surface 12a. The mounting surfaces 12a, 18a form an interface for fastening the swivel unit 12 to the traversing unit 13, with a spacer 14 provided between them. (The mounting surfaces 12a, 18a also allow fastening of the swivel unit 12 to the traversing unit 13 without an intermediate spacer 14. This is the subject of the first mode of mounting, to be explained in detail below). Between the swivel axis S of the swivel unit 12 and an outer surface of the rail (linear guide) 5 is a distance "a" which, besides the dimensions of the swivel unit 12 and the traversing unit 13, is dependent mainly on the thickness of the spacer 14).

Figure 7:
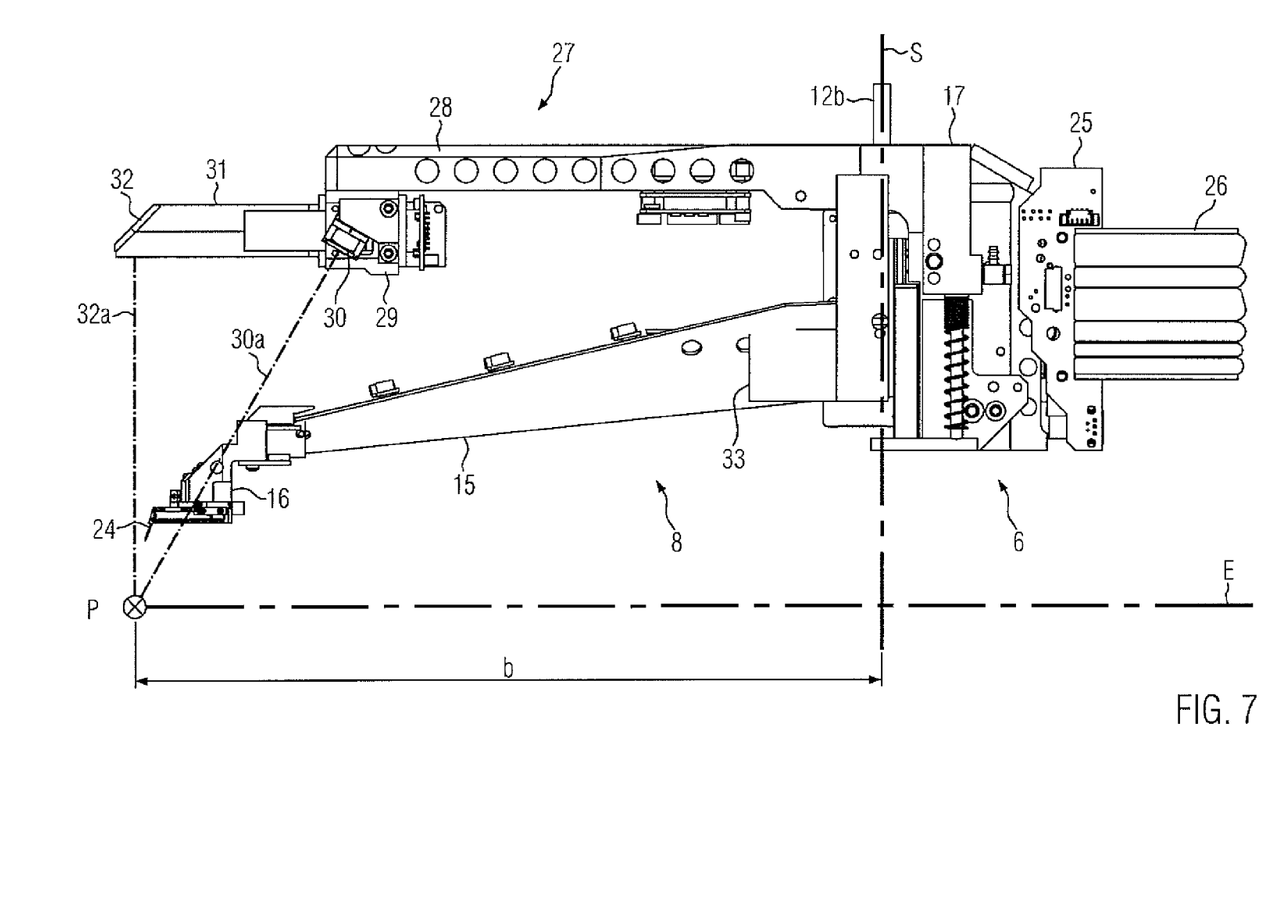
FIG. 7 is a view in the direction of arrow "VII" in FIG. 6.

FIG. 7 shows a bottom part of the positioning unit 6 with the test finger 8 in the direction of an arrow "VII" of FIG. 5. To be more specific, FIG. 6 shows only the lifting unit 17 of the positioning unit 6 and an output shaft 12b of the swivel unit 12, otherwise omitted from this illustration (cf. FIG. 6).

According to the illustration in FIG. 7, there is attached to the lifting unit 17 an electrical connection unit 25, to which is connected a cable feed reel 26 for connection to a system controller, not shown in detail.

The test finger 8 and a detection unit 27, described in detail below, may be swiveled together by the swivel unit (output axis 12b). The test finger 8 and the detection unit 27 are made as light as possible, to keep to a minimum the masses and moments of inertia to be borne. The swivel arm 15 is therefore also made of a carbon material.

The detection unit 27 has a holding arm 28 carrying at its end a camera module 29 in which is mounted a camera 30. In a further extension of the holding arm 28, a light guide unit 31 carrying a mirror 32 is mounted on the camera module 29. The mirror 32 is so aligned that an optical axis 32a falling from the mirror 32 at right-angles to the testing plane E continues to the camera unit 29. The camera 30 is so aligned that its optical axis 30a on the testing plane E coincides with the optical axis 32a of the mirror 32. The intersection point of the optical axes 30a, 32a coincides with a scanning point P which is to be scanned by the test needle 24.

The lifting unit 17 is firmly mounted on the swivel unit 12 and has a mimic (not shown in detail) which is so designed that the detection unit 27 is rotatably mounted in the mimic and held fixed in height (z position), but may be carried along in the swiveling direction by the output shaft 12b of the swivel drive. The test finger 8 is connected on the output side to a lifting drive (linear drive, not shown in detail) of the lifting unit 17, and is mounted axially flying but non-rotatable on the output shaft 12b of the swivel drive, so that the test finger 8 may be lowered and raised by the lifting drive, while being carried along by a rotary movement of the output shaft 12*b* of the swivel drive. In the Figure, the arrangement is shown with the test needle 24 lifted from the testing plane E.

In one design variant, the lifting drive itself may be mounted on a holder, also swiveling, of the swivel arm 15 of the test finger 8, resting on the output side on a mimic for supporting the detection unit 27. In a further variant, a lifting unit is connected immovably to the traversing unit, and the swivel unit is mounted on an output side of the lifting unit. In both variants, though, the inertial masses involved in the lifting movement (z movement) are increased.

As shown in FIG. 7, the swivel arm 15 of the test finger 8 is mounted on the drive side in a swivel arm holder 33 and connected on the sensor side to the needle holder 16. At these two points the swivel arm 15 may be released, so that the swivel arm 15 may be replaced with ease. Similarly, the holding arm 28 of the detection unit 27 may be released from connecting parts at the mimic of the lifting unit 17 and at the camera module 29, and likewise easily replaced. In this way it is possible to modify the test apparatus 1, as will be described below with the aid of FIGS. 8 to 10, with reference to the first type of assembly of the cross-bar unit 2 mentioned above in connection with FIG. 3.

Figure 8:
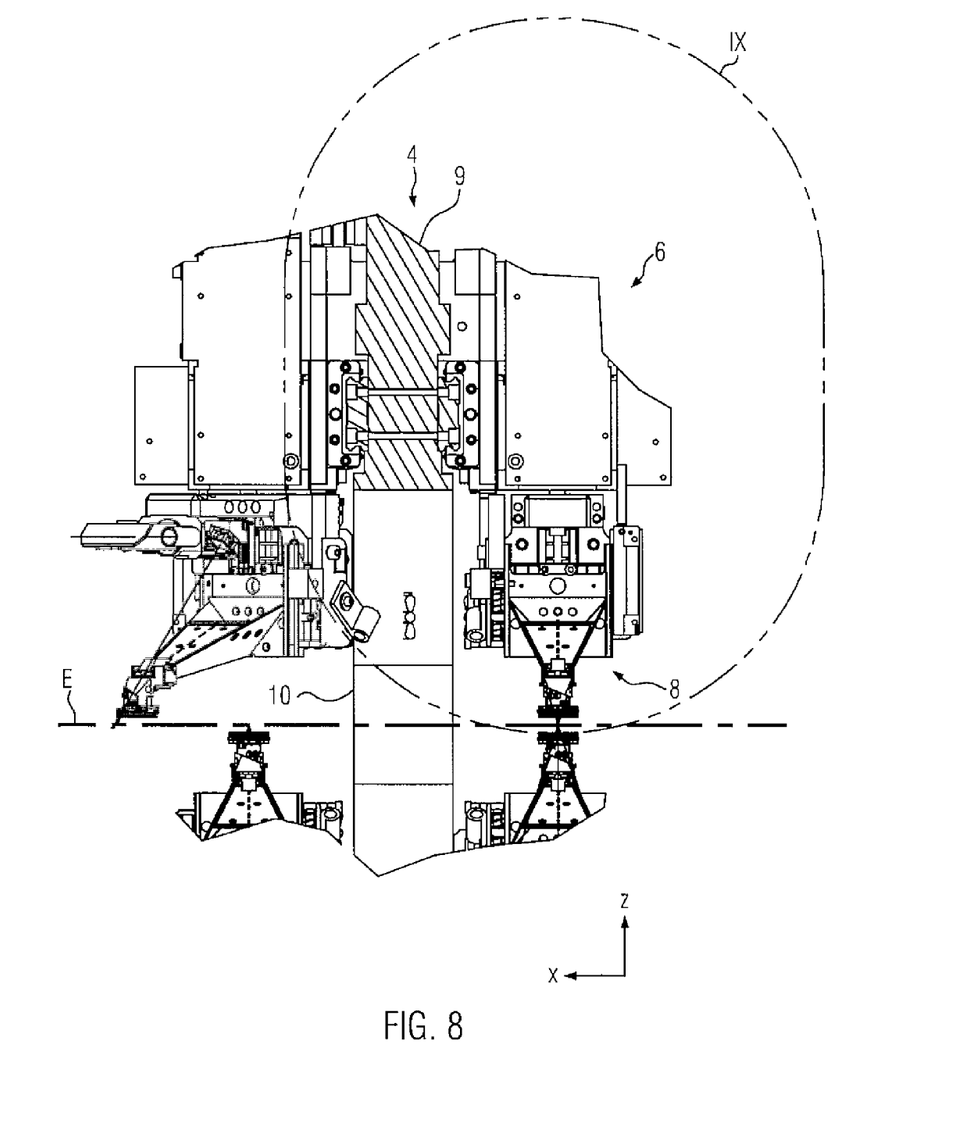
FIG. 8 is an enlarged detail view through a line "VIII" in FIG. 4.

At the same time FIG. 8 shows a detail, as indicated by a dot-dash line "VIII" in FIG. 4, in an enlarged view corresponding to FIG. 5. FIG. 9 shows a detail indicated by a dot-dash line "IX" in FIG. 8, in an even further enlarged view corresponding to FIG. 6, and FIG. 7 shows a bottom section of the positioning unit 6 with the test finger 8, in the direction of an arrow "X" of FIG. 9, in a view corresponding to FIG. 7. It should be noted that swivel positions of each test finger 8 in FIGS. 8 to 10 may differ from those of FIG. 3.

As is evident from the Figures, the structure of the cross-bar unit 2 in this first type of assembly is identical to that of the second type of assembly according to FIGS. 4 to 7 apart from the difference that the swivel unit 12 is mounted by its mounting surface 12*a* directly on the mounting surface 18*a* of the baseplate 18 of the traversing unit 13 without a spacer, and also that the swivel arm 15 of the test finger 8, together with the holding arm 28 of the detection unit 27, is shorter than in the second type of assembly. This makes the scanning width w (see FIG. 3) of the test fingers 8 of each cross-bar unit 2 smaller than in the second type of assembly (see FIG. 4), and on the stand formed by the two mounting beams 3 it is possible to mount two cross-bar units 2 instead of only one cross-bar unit 2. This increases the scanning density of the test fingers 8, and more test points may be scanned in the same time. In other words, the throughput of the test apparatus 1 is increased.

It is therefore possible to convert the test apparatus I from low to high throughput and vice-versa in a simple manner. If a test apparatus 1 is provided with only one cross-bar unit 2 according to the second type of assembly (FIGS. 4 to 7), then modification of the test apparatus 1 for higher throughput requires only relocation of the already available cross-bar unit 2 from the support surfaces 3*c* to the support surfaces 3*a* (or 3*b*) of the mounting beams 3, replacement of the swivel arms 15 and the holding arms 28 by in each case shorter versions, together with removal of the spacers 14, and the installation of a further cross-bar unit with shorter swivel arms 15 and holding arms 28 and without spacers on the respectively free support surfaces 3*a*, 3*b* of the mounting beams 3. A test apparatus 1 with two cross-bar units 2 according to the first type of assembly (FIGS. 1 to 3, 8 to 10) may be converted with relatively little effort into two test apparatus units with one cross-bar unit 2 each according to the second type of assembly by providing a further stand (mounting beam 3), placing one of the cross-bar units 2 from the test apparatus 1 already provided on the newly provided stand and mounting it thereon. The other of the cross-bar units 2 of the original test apparatus 1 is relocated on to the center support surfaces 3*c* and the positioning units 6 are repositioned by the inclusion of spacers 14 at the interface 12*a*, 18*a*, while at each of the positioning units 6 the swivel arms 15 and holding arms 28 are replaced by longer versions, and finally the conveyor and feed system for the circuit boards is adapted. It is true that each of the two newly created test apparatus units 1 operates with lower throughput than the old test apparatus 1, but it may be a sensible arrangement if two types of circuit board are to be tested simultaneously.

To simplify the conversion, a set of spacers 14, swivel arms 15 and holding arms 28 may be put together in a common modification kit for a frame 4 or a cross-bar unit 2, wherein the modification kit should be identified for the correct assignment solely by the scanning width w of the cross-bar unit 2. For the smallest scanning width w, the spacers 14 may be omitted from the modification kit.

Naturally, not only two scanning widths w are possible, but rather any desired number of scanning widths w depending on the number of cross-bar units 2 which may be mounted on one stand, and the support surfaces (mounting points) provided on the stand.

A test apparatus 1 with two types of assembly has been described above, in which the testing plane E is arranged horizontally. It is equally conceivable for the testing plane E to be arranged at any desired angle to the field of gravity. All directional details in the application are to be understood in such a way that the test field plane E defines the horizontal (xy) and a direction at right-angles thereto defines the vertical (z), irrespective of the geographical position in the field of gravity.

In the present embodiment, the lifting unit has a linear motor as lifting motor. Alternatively the lifting unit may have a piston, operated by magnetic, pneumatic or hydraulic means, or a movement thread, or may be designed in a quite different manner. In the present embodiment the swivel unit 12 has a step motor as swivel motor. Alternatively the swivel unit 12 may have a piston or a linear motor with a curved movement path.

LIST OF REFERENCE NUMBERS

1 test apparatus
2 cross-bar unit
3 mounting beam (stand)
3*a*, 3*b*, 3*c* support surfaces
4 cross-bar unit (frame)
5 rail (linear guide)
5*a* counterbored hole
6 positioning unit
7 stator unit (linear drive unit)
8 test finger
9 cross-bar
9*a* stator locating surface
9*b* top edge
9*c* rail locating surface
9*d* step
9*e* hole
10 crosspiece (connection piece)
11 end stop
12 swivel unit 12a mounting surface
12b output shaft
13 slide (traversing unit)
14 spacer
15 swivel arm
16 needle holder
17 lifting unit
18 baseplate
18a mounting surface
sliding block
20 rotor unit (linear drive unit)
21 position encoder
22 permanent magnet (stator unit)
23 magnetic tape
24 test needle (contact probe)
25 electrical connection unit
26 cable feed reel
27 detection unit
28 holding arm
29 camera module
30 camera
30a optical axis
31 light guide unit
32 mirror
32a optical axis
33 swivel arm holder
a axial distance
b sensor distance
r frame distance
w scanning width
x, y, z spatial directions
x longitudinal direction (feed direction)
y transverse direction
z vertical direction
E testing plane
P scanning point
S swivel axis The above list of reference numbers and symbols is an integral part of the specification.

What is claimed is:

1. A cross-bar unit for a test apparatus for circuit boards wherein the cross-bar unit has at least one cross-bar extending over and spanning a test field in which a circuit board to be tested may be placed, and is configured to hold a plurality of positioning units having a plurality of test fingers in a linearly traversable manner so that the test fingers are able to scan at least part of the test field,
wherein the cross-bar unit holds at least two linear guides extending over and spanning the test field, independent of one another, for guiding in each case at least one of the positioning units mounted directly thereon;
wherein the at least two linear guides are rails and are mounted directly on the cross-bar unit alongside the at least one cross-bar.

2. The cross-bar unit of claim 1, wherein:
the at least two linear guides are provided at a side of each cross-bar.

3. The cross-bar unit of claim 1, wherein:
at least one of the cross-bar has two linear guides mounted directly thereon, with the two linear guides running parallel to one another.

4. The cross-bar unit of claim 3, wherein:
the cross-bar unit has at least two cross-bars spanning the test field, wherein each of the at least two cross-bars has at least one of the linear guides, wherein the at least two cross-bars preferably run parallel to one another.

5. The cross-bar unit of claim 4, wherein:
of the at least two cross-bars, at least one runs on one side of a test field plane (E) of the test field and at least one runs on another side of the test field plane (E).

6. The cross-bar unit of claim 5, wherein:
the at least two cross-bars are exactly two cross-bars, joined by connection pieces to form an annular shape of at least substantially rectangular pattern so that the cross-bar unit spans the test field in such a way that the test field is positioned between the two cross-bars.

7. The cross-bar unit of claim 1, wherein:
the cross-bar unit is configured for fixed mounting at preset connection points of a stand of the test apparatus.

8. The cross-bar unit of claim 1, wherein:
each positioning unit has a swivel unit and a traversing unit, wherein each test finger has a swivel arm joined to the swivel unit of an associated positioning unit and a test probe fastened to the swivel arm, wherein each traversing unit is mounted in one of the linear guides and is configured to traverse by a drive unit, and wherein the linear guides are mounted on the cross-bar unit.

9. The cross-bar unit of claim 8, wherein:
an axial distance (a) of a swivel axis (S) of the swivel unit of the positioning units from the respective linear guide and/or a probe distance (b) of a test probe from the swivel axis (S) of the swivel unit of a particular positioning unit is changeable, wherein the axial distance (a) and/or the probe distance (b) are preferably changeable in preset steps.

10. The cross-bar unit of claim 9, wherein:
connection surfaces of two structural elements of the positioning units are configured as an interface for changing the axial distance (a), wherein spacers of preset thickness may be fitted to change the axial distance (a) between the connection surfaces.

11. The cross-bar unit of claim 10, wherein:
the swivel arm of different test fingers have different lengths for changing the probe distance (b), and are mounted between the swivel axis (S) and the test probe.

12. The cross-bar unit of claim 11, wherein:
the probe distance (b) are adapted to the respective axial distance (a), wherein the spacers for fixing the axial distance (a) and swivel arms for fixing the probe distance (b) are provided with matching spacer thicknesses and swivel arm lengths respectively.

* * * * *